United States Patent [19]
Po

[11] Patent Number: 5,241,860
[45] Date of Patent: Sep. 7, 1993

[54] IN THE STRUCTURE OF A NOTE INSPECTING DEVICE

[76] Inventor: Yahg C. Po, P.O. Box 82-144, Kao Hsiung, Taiwan

[21] Appl. No.: 814,584

[22] Filed: Dec. 30, 1991

[51] Int. Cl.$^5$ .......................................... G01D 11/24
[52] U.S. Cl. ...................................... 73/431; 403/330
[58] Field of Search .................. 73/865.8, 865.9, 431; 434/110; 194/206, 207; 340/825.34; 403/119, 321, 322, 326, 330, 112, 113, 116

[56] References Cited

U.S. PATENT DOCUMENTS

| | | | |
|---|---|---|---|
| 3,253,310 | 5/1966 | McCarthy | 403/326 |
| 3,596,942 | 8/1971 | Zoebelein | 403/330 |
| 3,864,050 | 2/1975 | Thomas | 403/330 |
| 4,880,096 | 11/1989 | Kobayashi et al. | 194/206 |

Primary Examiner—Robert Raevis
Attorney, Agent, or Firm—Alfred Lei

[57] ABSTRACT

This invention relates to an improvement in the structure of a note inspecting device and in particular to one including an upper body provided with a protuberance at two ends of both sides, a lower body provided with a vertical groove and a L-shaped groove at both sides and a slot below the vertical groove, and two retainers each having an engaging portion at a lower end, a press plate at an upper end, and a recess just below the press plate, whereby the upper body and the lower body may be firmly connected together and may be dismantled from each other without using a tool.

1 Claim, 4 Drawing Sheets

IN THE STRUCTURE OF A NOTE INSPECTING DEVICE

BACKGROUND OF THE INVENTION

It has been found that the prior art note inspecting device (see FIG. 1) on the market is composed of an upper body A and a lower body B which are simply joined together by screws C. However, when required to inspect to maintain the note inspecting device, it is necessary to use a tool such as a screw driver to dismantle the upper body from the lower body hence causing much inconvenience.

Therefore, it is an object of the present invention to provide an improvement in the structure of a note inspecting device which may obviate and mitigate the above-mentioned drawbacks.

SUMMARY OF THE INVENTION

This invention relates to an improvement in the structure of a note inspecting device.

It is the primary object of the present invention to provide an improvement in the structure of a note inspecting device which may be easily dismantled without tools.

It is another object of the present invention to provide an improvement in the structure of a note inspecting device which is simple in construction.

It is still another object of the present invention to provide an improvement in the structure of a note inspecting device which is economic to produce.

It is still another object of the present invention to provide an improvement in the structure of a note inspecting device which is fit for mass production.

It is a further object of the present invention to provide an improvement in the structure of a note inspecting device which is facile to manufacture.

Other objects and merits and a fuller understanding of the present invention will be obtained by those having ordinary skill in the art when the following detailed description of the preferred embodiment is read in conjunction with the accompanying drawings.

DETAILED DESCRIPTION OF THE PREFERRED EMBODIMENT

The present invention is related to an improved casing for a note inspecting device. The interior of the note inspecting device is well known in the art and has no need to be mentioned here in detail.

Figure 1:
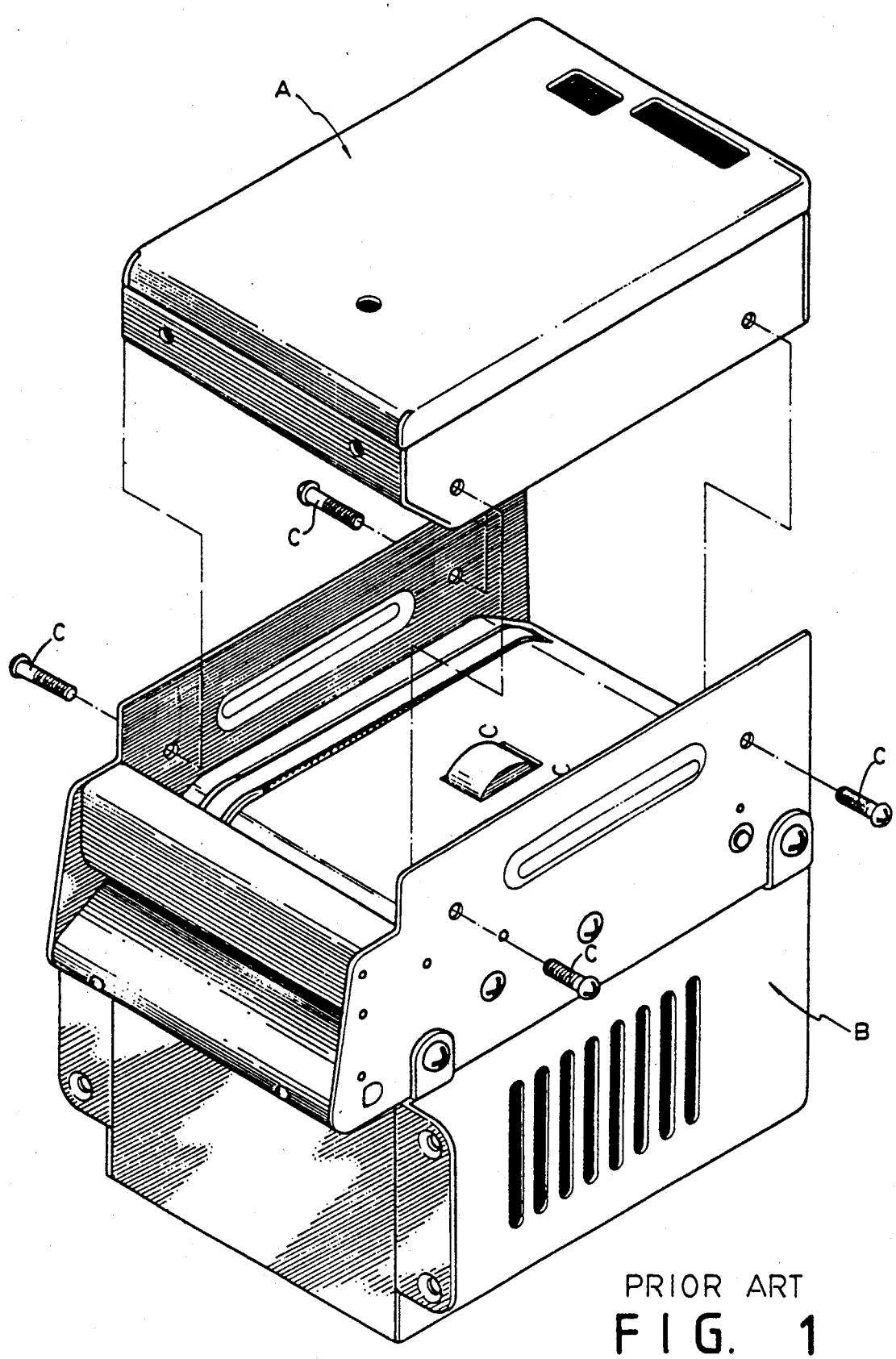
FIG. 1 is an exploded view of a prior art note inspecting device.
Figure 2:
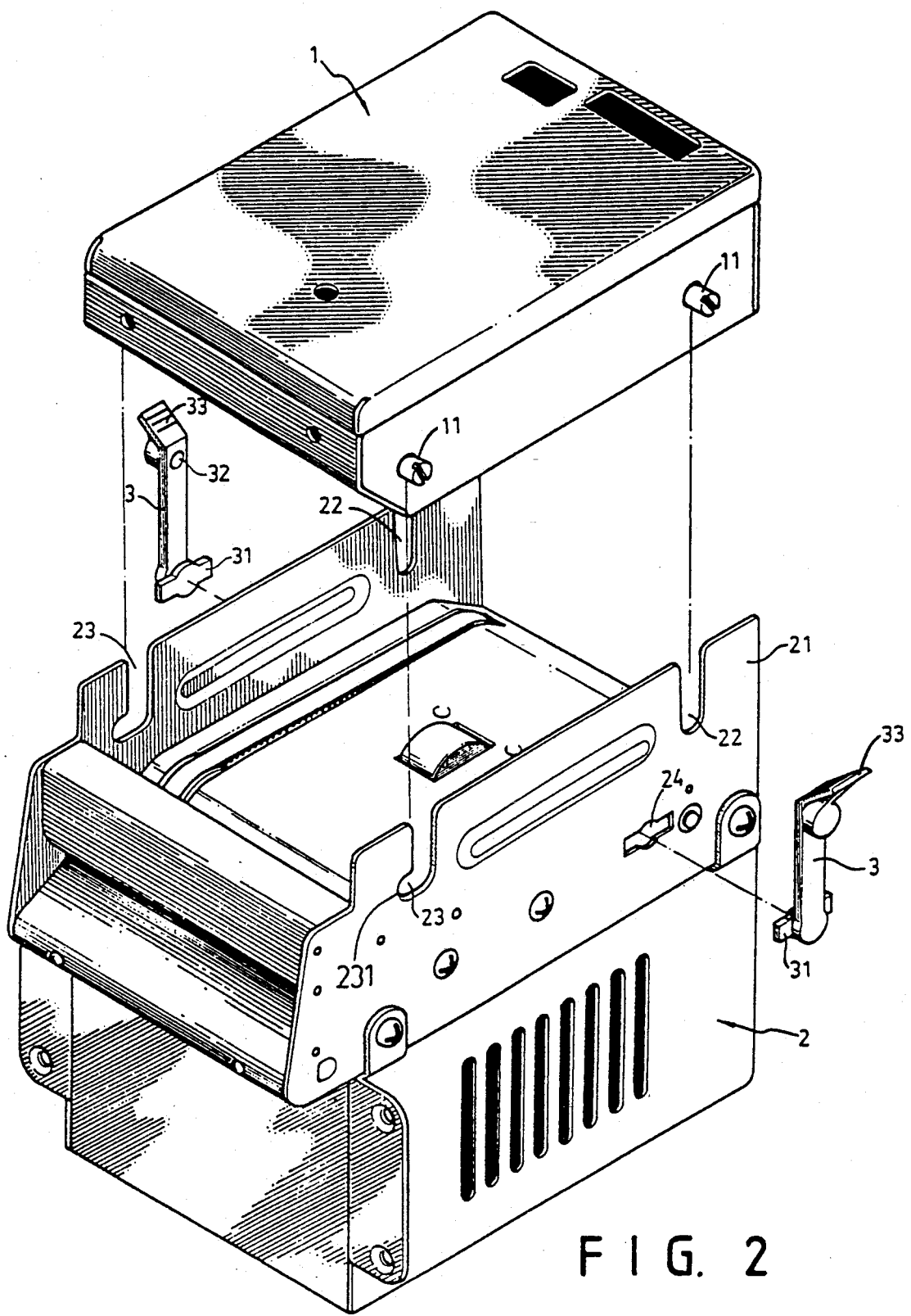
FIG. 2 is an exploded view showing the improvement in the structure of a note inspecting device according to the present invention.

With reference to the drawings and in particular to FIG. 2 thereof, the present invention mainly comprises an upper body 1 and a lower body 2. The upper body 1 is provided with a protuberance 11 at two ends of both sides, while the lower body 2 provided at both sides with a vertical groove 22 and a L-shaped groove 23 adapted to the corresponding protuberances 11. Below the vertical groove 22 there is a slot 24 on the lower body 2. The engaging portion 31 provided at the lower end of a retainer 3 is connected with the slot 24 so that the retainer 3 may be rotated with respect to the slot 24. The retainer 3 is formed with a press plate 33 at the upper end and a recess 32 just below the press plate 33. The retainer 3 further has a flexible portion at least between the engaging portion 31 at the lower end and the press plate 33 to permit the recess 32 to be disengaged from the corresponding protuberance 11 while the engaging portion 31 engaging the slot 24 of the lower body 2.

Figure 3:
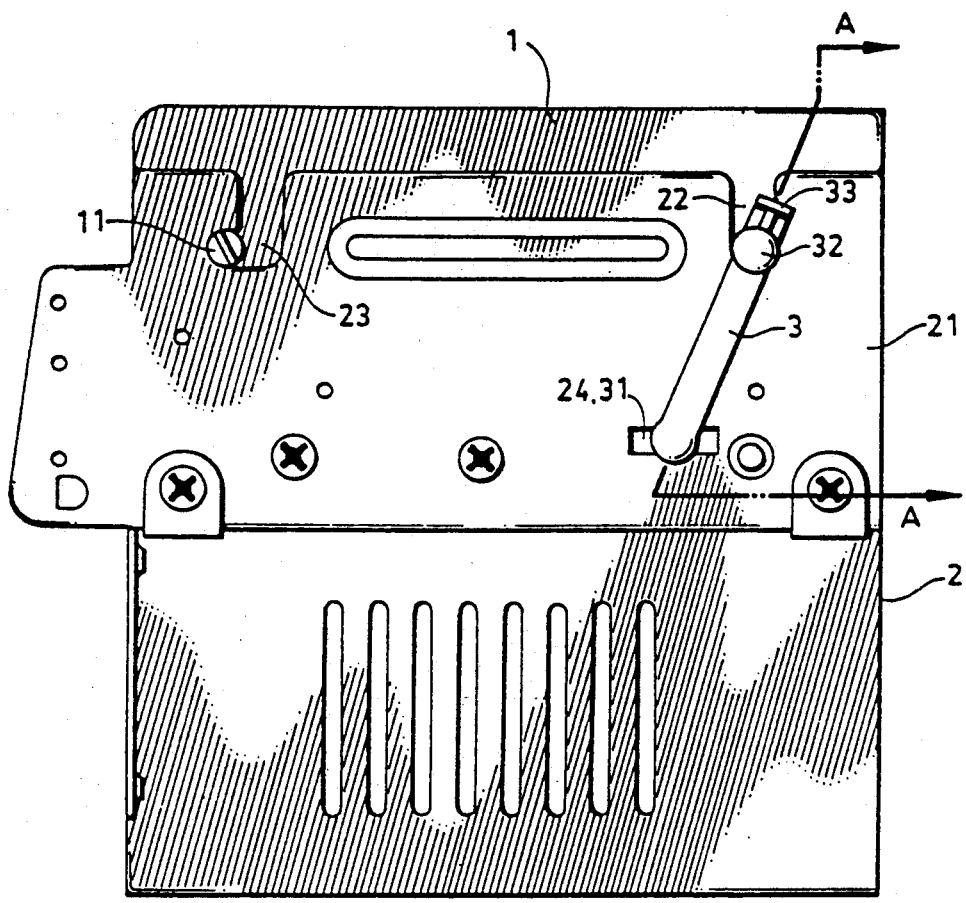
FIG. 3 is a side view of the present invention.
Figure 4:
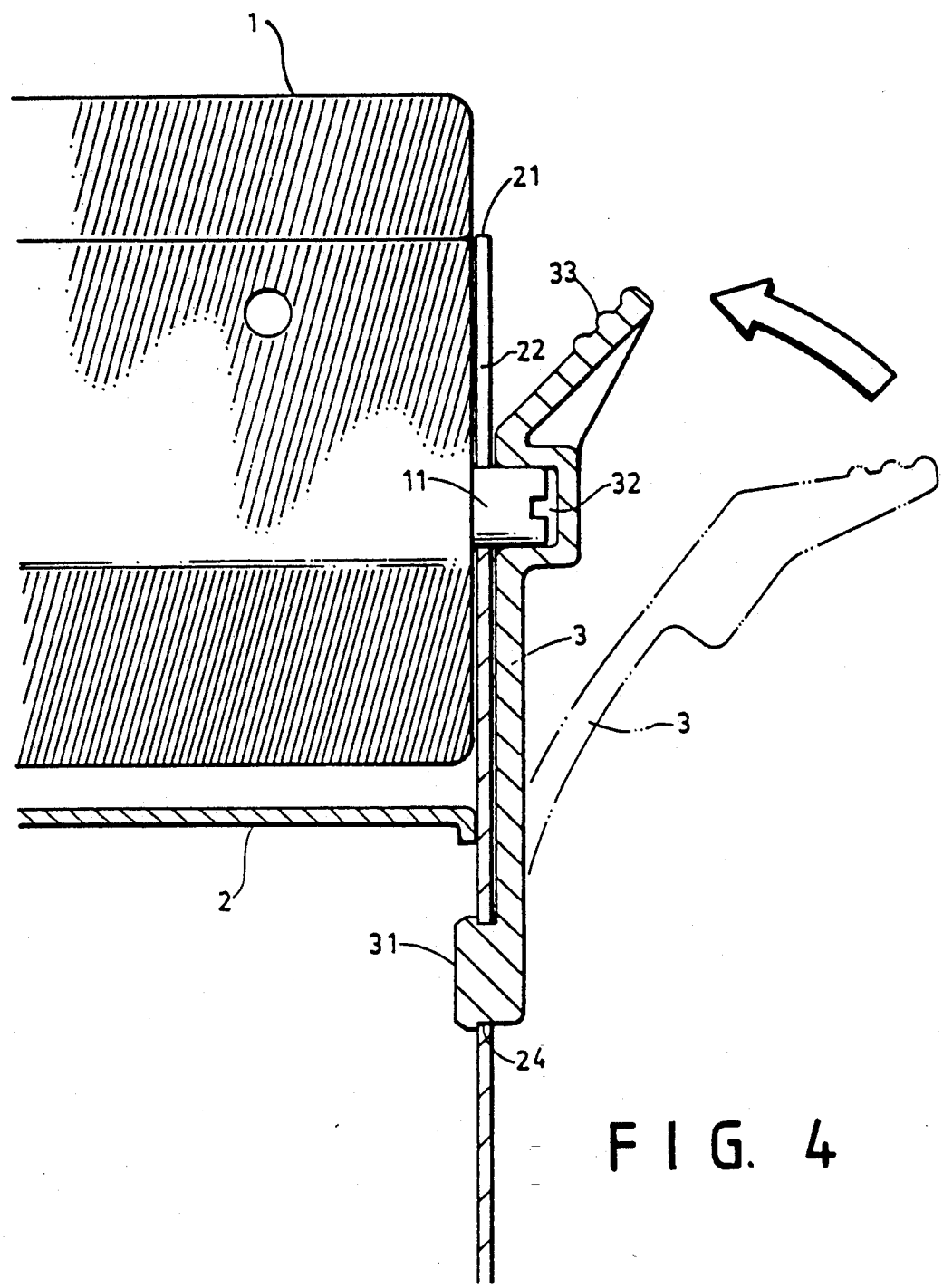
FIG. 4 is a sectional view taken along line A—A of FIG. 3.

Looking now at FIGS. 3 and 4, when in assembly, simply put the upper body 1 onto the lower body 2 with the protuberances 11 of the upper body 1 engaged with corresponding vertical grooves 22 and L-shaped grooves 23. Then, fit the recess 32 of the retainer 3 with the protuberance 11 extending out of the vertical groove 22. In the meantime, the other protuberances 11 will bear against the end 231 of the L-shaped groove 23. Hence, the upper body 1 may be firmly engaged with the lower body 2.

When required to dismantle the upper body 1 from the lower body 2, it is only necessary to press the press plates 33 of the retainers 3 with fingers outwards so as to disengage the recess 32 of the retainer 3 from the protuberance 11 of the upper body 1 thereby enabling the upper body 1 to be detached from the lower body 2.

Although the present invention has been described with a certain degree of particularity, it is understood that the present disclosure is made by way of example only and that numerous changes in the detail of construction and the combination and arrangement of parts may be resorted to without departing from the spirit and scope of the invention as hereinafter claimed.

I claim:

1. A casing for a note inspecting device comprising:
an upper body provided with a protuberance at two ends of both sides;
a lower body provided with a vertical groove and a L-shaped groove at both sides and a slot below said vertical groove, the vertical groove and said L-shaped groove being adapted to receive a corresponding protuberance; and
two retainers each having an engaging portion at a lower end, a press plate at an upper end, and a recess just below said press plate, the engaging portion engaging the slot of said lower body, each of said retainers further having a flexible portion at least between the engaging portion at the lower end and the press plate to permit the recess to be disengaged from the corresponding protuberance while the engaging portion engages the slot of said lower body;
whereby said upper body and said lower body may be firmly connected together and may be dismantled from each other without using a tool.

* * * * *